United States Patent
Nebashi et al.

(10) Patent No.: US 9,692,422 B2
(45) Date of Patent: Jun. 27, 2017

(54) PROGRAMMABLE LOGIC INTEGRATED CIRCUIT

(71) Applicant: NEC Corporation, Tokyo (JP)

(72) Inventors: Ryusuke Nebashi, Tokyo (JP); Makoto Miyamura, Tokyo (JP); Noboru Sakimura, Tokyo (JP); Yukihide Tsuji, Tokyo (JP); Ayuka Tada, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 15/122,433

(22) PCT Filed: Feb. 27, 2015

(86) PCT No.: PCT/JP2015/001049
§ 371 (c)(1),
(2) Date: Aug. 30, 2016

(87) PCT Pub. No.: WO2015/141153
PCT Pub. Date: Sep. 24, 2015

(65) Prior Publication Data
US 2017/0070228 A1    Mar. 9, 2017

(30) Foreign Application Priority Data

Mar. 17, 2014  (JP) .................................. 2014-053302

(51) Int. Cl.
*H03K 19/003*  (2006.01)
*H03K 19/177*  (2006.01)
(Continued)

(52) U.S. Cl.
CPC ....... *H03K 19/17736* (2013.01); *G11C 29/86* (2013.01); *H03K 19/1736* (2013.01); *H03K 19/1776* (2013.01)

(58) Field of Classification Search
None
See application file for complete search history.

(56) References Cited

U.S. PATENT DOCUMENTS

| 4,899,067 A | 2/1990 | So et al. |
| 6,344,755 B1 * | 2/2002 | Reddy .............. H03K 19/17764 326/10 |

(Continued)

FOREIGN PATENT DOCUMENTS

| JP | S 49-19780 A | 2/1974 |
| JP | H 4-146664 A | 5/1992 |

(Continued)

OTHER PUBLICATIONS

International Search Report (ISR) (PCT Form PCT/ISA/210), in PCT/JP2015/001049, dated May 26, 2015.

(Continued)

*Primary Examiner* — Anh Tran
(74) *Attorney, Agent, or Firm* — McGinn IP Law Group, PLLC

(57) ABSTRACT

In a programmable logic integrated circuit, providing a spare circuit in preparation for the occurrence of a defective element results in a redundant circuit configuration. A programmable logic integrated circuit according to the present invention has: a plurality of logic blocks; a switch block for switching the connections between row and column wires by nonvolatile switch elements for switching; and a shifter block for connecting an input/output wire to said switch block. The shifter block includes a redundant wire and is equipped with nonvolatile switch elements for shifting that control the connections of the wires constituting said redundant wire and said row wires.

10 Claims, 10 Drawing Sheets

(51) Int. Cl.
    *H03K 19/173*      (2006.01)
    *G11C 29/00*       (2006.01)

(56)                References Cited

U.S. PATENT DOCUMENTS 7,772,872 B2*    8/2010  Lewis .............. H03K 19/00392
                                                          326/10
    2003/0072185 A1* 4/2003  Lane ................ H03K 19/17736
                                                       365/189.02
    2004/0153752 A1  8/2004  Sutardja et al.
    2008/0211539 A1* 9/2008  Parkinson .......... G11C 13/0004
                                                          326/41
    2009/0034325 A1* 2/2009  Lowrey ............. G11C 13/0004
                                                         365/163
    2009/0102503 A1  4/2009  Saito

FOREIGN PATENT DOCUMENTS

JP         H06-216757 A       8/1994
    JP         2002-009156 A      1/2002
    JP         2004-214619 A      7/2004
    JP         2005-101535 A      4/2005
    WO       WO 2007/032184 A1    3/2007
    WO       WO 2013/136798 A1    9/2013

OTHER PUBLICATIONS

W. H. Mangione-Smith, J. Lach, and M. Potkonjak, "Low Overhead Fault-Tolerant FPGA Systems", IEEE Transactions on Very Large Scale Integration (VLSI) Systems, vol. 6, No. 2, pp. 212-221, Jun. 1998.
PCT/ISA/237 (English version), in PCT/JP2015/001049, dated May 26, 2015.

* cited by examiner

PROGRAMMABLE LOGIC INTEGRATED CIRCUIT

TECHNICAL FIELD

The present invention relates to a programmable logic integrated circuit, and, more particularly, relates to a programmable logic integrated circuit using a variable resistance element.

BACKGROUND ART

A programmable logic integrated circuit has a feature that various logic circuits can be reconstructed by rewrite of the inner setting information. Therefore, it is used in a wide range of fields such as production of a prototype, image processing and communication.

Patent literature 1 (PTL1) relates to a programmable logic integrated circuit, and proposes to replace a memory cell and a switch part using a variable resistance element. A programmable logic integrated circuit described in PTL1 is a hopeful technology since reduction in chip areas and power consumption can be expected.

Patent literature 2 (PTL2) and patent literature 3 (PTL3) relate to a programmable logic integrated circuit, and propose to form a spare circuit in advance, and, when a defective circuit occurs, replace the defective circuit with the spare circuit.

Non patent literature 1 (NPL1) relates to a programmable logic integrated circuit, and proposes to calculate configuration data based on information on a position of a defective element to avoid the defective position. A programmable logic integrated circuit of NPL1 is influential since a yield of a chip can be improved without overheads of a chip area.

CITATION LIST

Patent Literature

[PTL1] Japanese Patent Application Laid-Open No. 2005-101535
[PTL2] U.S. Pat. No. 4,899,067
[PTL3] Japanese Patent Application Laid-Open No. Hei 6-216757

Non Patent Literature

[NPL1] W. H. Mangione-Smith, J. Lach, and M. Potkonjak, "Low Overhead Fault-Tolerant FPGA Systems", IEEE Transactions on Very Large Scale Integration (VLSI) Systems, vol. 6, no. 2, pp. 212-221, June 1998

SUMMARY OF INVENTION

Technical Problem

However, programmable logic integrated circuits proposed by the preceding technical literatures mentioned above have following problems.

In PTL2 and PTL3, when there is no defect in a programmable logic integrated circuit, a spare circuit is not used, and, thus, an overhead of a chip area, a delay time and electric power consumption is caused. On the other hand, in a case where a user desires to use a spare circuit effectively to realize more various kinds of logic even if a variation of quality of a programmable logic integrated circuit is caused by occurrence of a defective device, it is desirable to be able to provide a programmable logic integrated circuit which can meet such requirement.

In a programmable logic integrated circuit of NPL1, there is anxiety that, when a usage rate of resources becomes high and wirings which is being used are crowded, creation of configuration data to bypass a defective element comes to be impossible. In such a case, according to variation of positions of defective elements for each chip, chips for which configuration data can be created and chips for which configuration data cannot be created are generated. In other words, it may become difficult to keep quality of a programmable logic integrated circuit.

An object of the present invention is to provide a programmable logic integrated circuit which settles the problem that, when a spare circuit is provided in preparation for occurrence of a defective element in a programmable logic integrated circuit, a waste is caused in a circuit configuration.

Solution to Problem

To achieve the above-mentioned object, a programmable logic integrated circuit according to the present invention comprises: a plurality of logic blocks; a switch block which switches connection between row wiring and column wiring by a non-volatile switching element for switching; and a shifter block which connects input-output wiring to the switch block, wherein
the shifter block includes a redundant wiring, and is provided with a non-volatile switching element for shifting to control connection of each wiring included in the redundant wiring and the row wiring.

Advantageous Effect of Invention

According to the present invention, desired operations can be realized and a circuit configuration can be used effectively, even when a defective element occurs.

DESCRIPTION OF EMBODIMENTS

Figure 10:
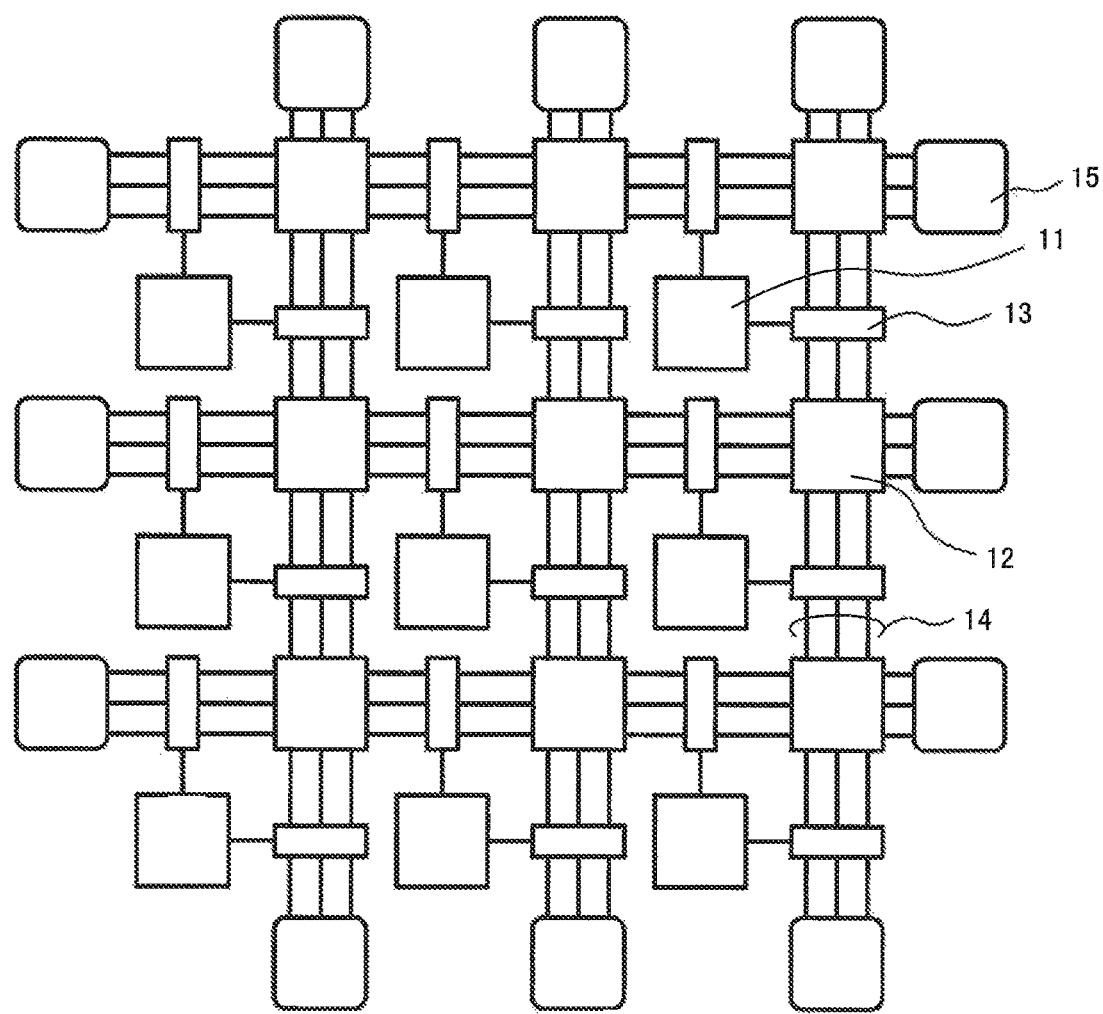
FIG. 10 is a block diagram indicating a structure of a related programmable logic integrated circuit roughly.

Before describing a preferred exemplary embodiment of the present invention, a related programmable logic integrated circuit will be described with reference to a drawing. As shown in FIG. 10, a programmable logic integrated circuit of the related art includes a logic block 11, a switch block 12, a connection block 13, wirings or tracks 14, and an I/O (Input/Output) block 15. FIG. 10 shows a case where the number of pieces of logic block 11 is 3×3. The logic block 11 performs a logical operation. The switch block 12 connects between the wirings 14. The connection block 13 connects the wiring 14 and the logic block 11. The I/O block 15 is in charge of connection with outside. A logic of the logic block 11 and a connection relationship of the switch block 12 and the connection block 13 are stored in a memory cell such as a static random access memory (SRAM) as setting information. To write configuration data in a memory cell is called programming. Usually, memory cells are connected serially, and data is written in successively.

In a programmable logic integrated circuit of the related art, various circuit functions are realized by programming memory cells. A change of circuitry is realized by rewriting configuration data. In a programmable logic integrated circuit, the present invention improves flexibility of circuit usage and improves a possibility of a circuitry change. Hereinafter preferred exemplary embodiments of the present invention will be described.

[First Embodiment]

Figure 1:
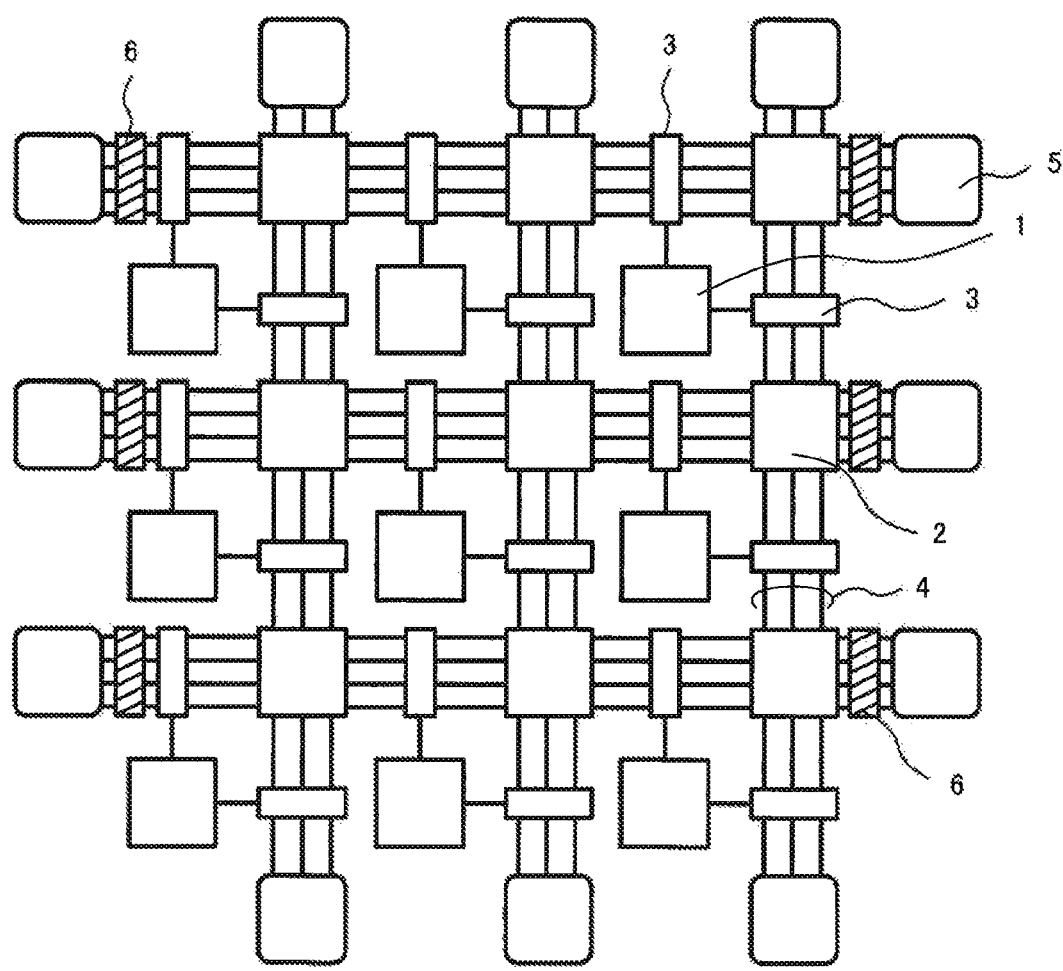
FIG. 1 is a block diagram showing a structure of a programmable logic integrated circuit according to a first exemplary embodiment of the present invention.
Figure 2:
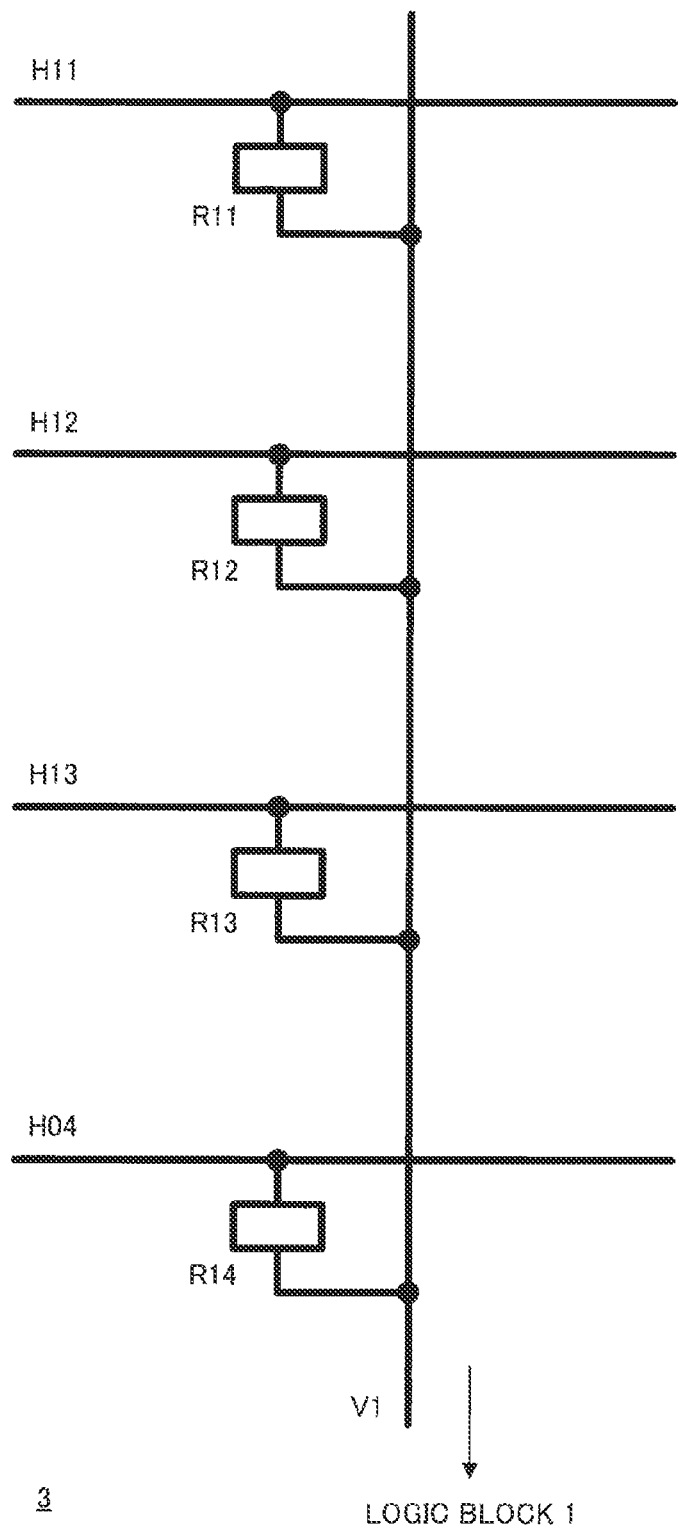
FIG. 2 is a circuit diagram showing an example of a structure of a connection block forming a programmable logic integrated circuit according to the first exemplary embodiment of the present invention is composed.
Figure 3:
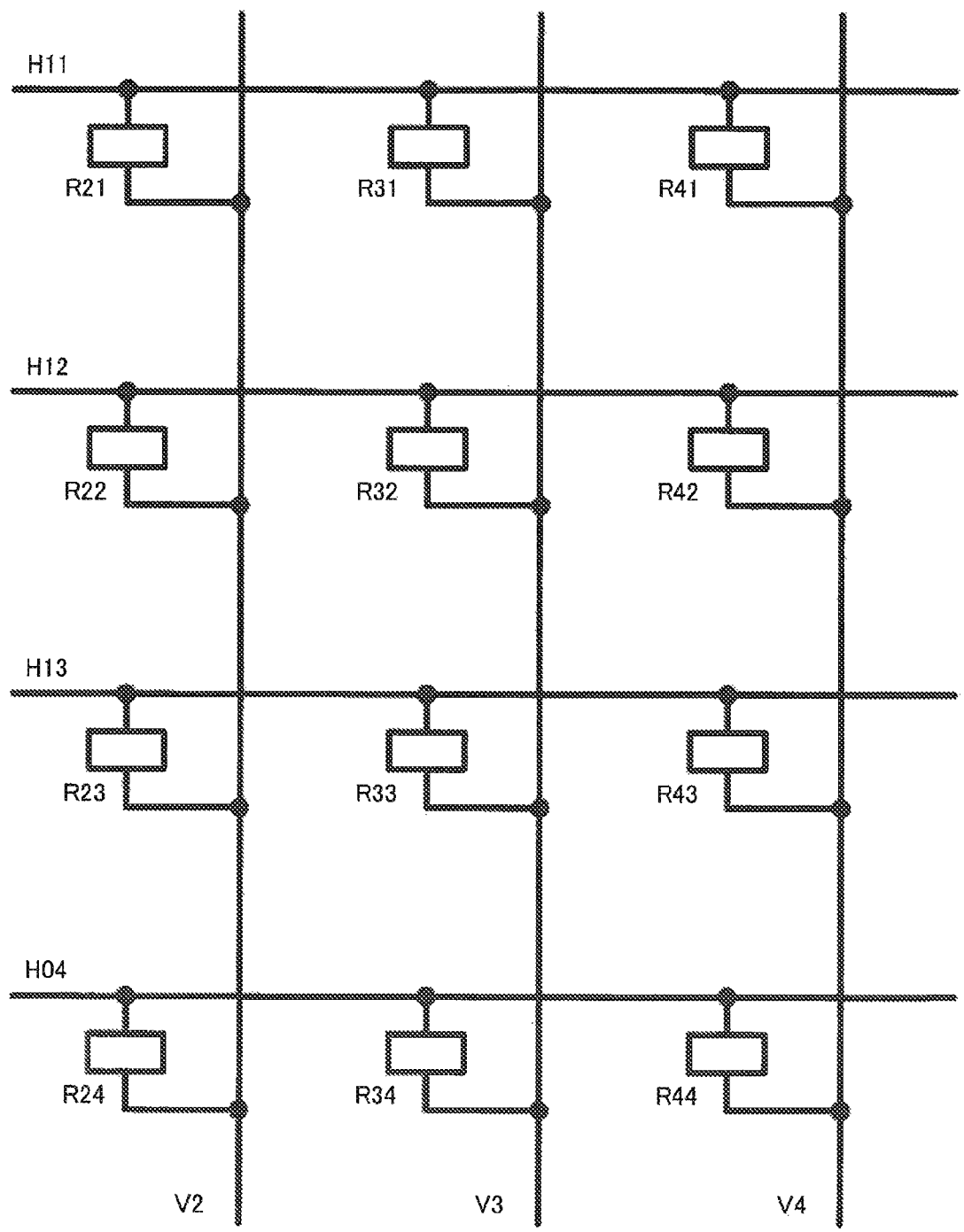
FIG. 3 is a circuit diagram showing an example of a structure of a switch block forming a programmable logic integrated circuit according to the first exemplary embodiment of the present invention.
Figure 4:
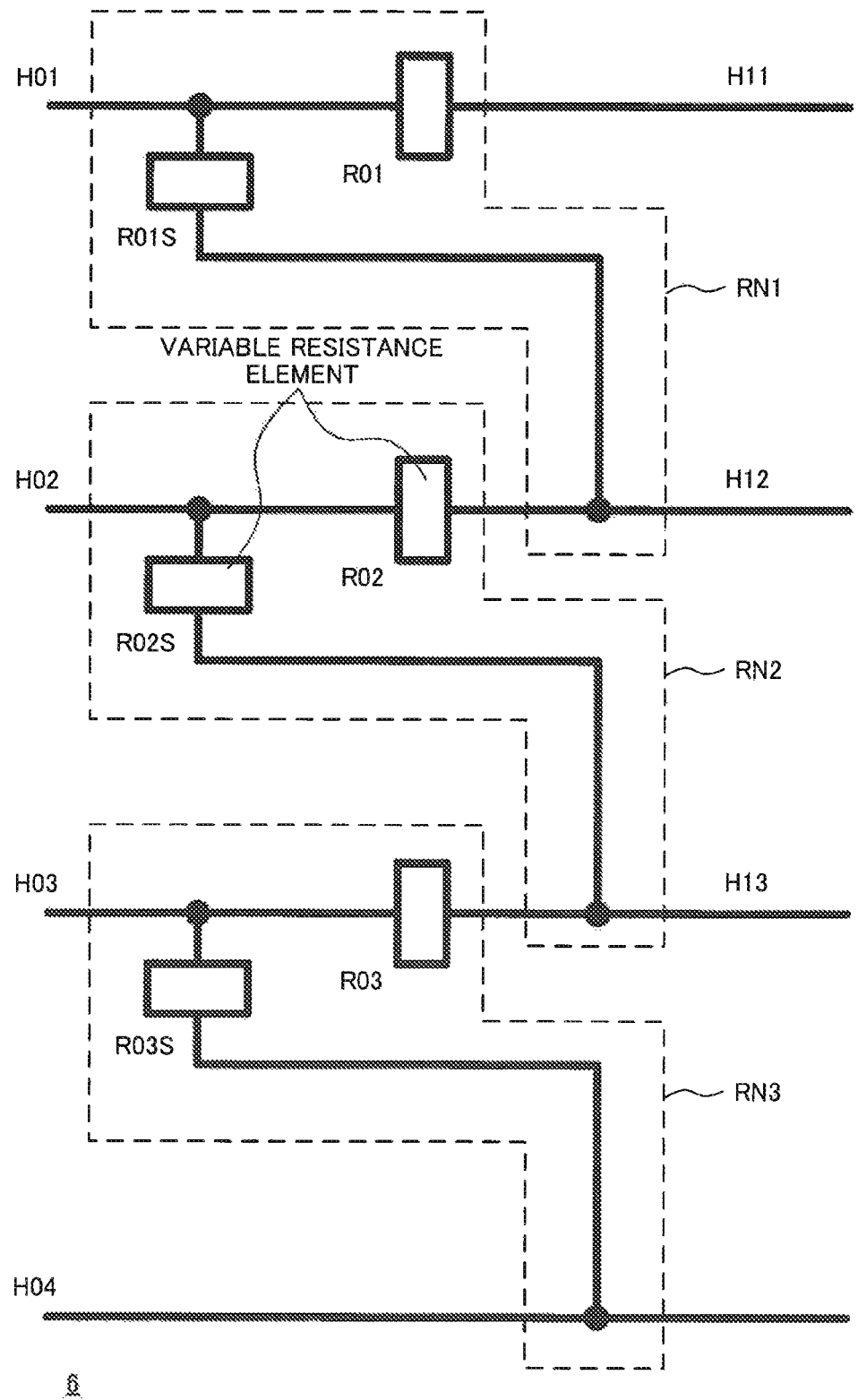
FIG. 4 is a circuit diagram showing an example of a structure of a shifter block forming a programmable logic integrated circuit according to the first exemplary embodiment of the present invention.

A programmable logic integrated circuit according to the first exemplary embodiment of the present invention will be described. FIG. 1 is a block diagram showing a structure of a programmable logic integrated circuit in the first exemplary embodiment of the present invention. FIG. 2 is a circuit diagram showing an example of a connection block of FIG. 1. FIG. 3 is a circuit diagram showing an example of a switch block of FIG. 1. FIG. 4 is a circuit diagram showing an example of a shifter block of FIG. 1.

As shown in FIG. 1, a programmable logic integrated circuit according to this exemplary embodiment includes a plurality of logic blocks 1, and a switch block 2 to switch a connection of row wiring and column wiring by a non-volatile switching element for switching. In addition, the programmable logic integrated circuit according to this exemplary embodiment includes a shifter block 6 which connects input-output wiring with the switch block 2. The shifter block 6 is characterized by including a redundant wiring, and provided with a non-volatile switching element for shifting to control a connection of each wiring constituting the redundant wiring and the row wiring. As shown in FIG. 1, the programmable logic integrated circuit according to this exemplary embodiment further includes a connection block 3, a wiring or a track, and an I/O (Input/Output) block 5. The wiring or the track will be described below taking a wiring 4 as an example. In the switch block 2, a connection state between row wiring and column wiring can be set to a connecting state by making non-volatile switching element for switching of the crossing position in question be an on state, and it can be set to a non-connecting state by making it be an off state. Although description will be made about a case in which a variable resistance element is used as an example of the non-volatile switching element for switching of the switch block 2 below, the present invention is not limited to this. Although description will be made about a case in which a variable resistance element is used as an example of the non-volatile switching element for shifting in the shifter block 6 below, the present invention is not limited to this.

In FIG. 1, a case when pieces of logic block 1 are arranged in a matrix shape of 3×3 is being illustrated. The wiring 4 is arranged in a manner that it surrounds the logic block 1. In FIG. 1, the number of wirings in the row direction is 4 and the number of wirings in the column direction is 3. The switch block 2 is arranged in a position where wiring of the row direction and wiring of the column direction intersect with each other. The switch block 2 is connected to three wirings in the vertical direction, and to four wirings in the horizontal direction. One wiring among four wirings in the horizontal direction is a spare wiring. The connection block 3 is arranged on wiring in the row direction or on wiring in the column direction. The shifter block 6 is arranged in both ends of the wiring 4 that runs in the row direction. The logic block 1 performs a logical operation. The switch block 2 connects between the wirings 4. The connection block 3 connects the wiring 4 and the logic block 1. The I/O block 5 is in charge of connection with outside. The shifter block 6 connects between the wirings 4. A programmable logic integrated circuit of this exemplary embodiment is different from a programmable logic integrated circuit of the related art in a point that it further includes the shifter block 6 and a spare wiring.

FIG. 2 indicates an example of a structure of the connection block 3 of FIG. 1, and includes wirings H11, H12, H13, H04 and V1, and variable resistance elements R11, R12, R13 and R14. Here, the wiring H04 is a spare wiring, and the variable resistance element R14 is a spare variable resistance element. The connection block 3 of FIG. 2 can be used when performing connection from four wirings to one input port of the logic block 1, or when performing connection from one output port of the logic block 1 to a wiring selected among four wirings.

As a variable resistance element, a memory element such as a phase change random access memory (PRAM), a resistance random access memory (ReRAM) and a conductive bridge random access memory (CBRAM) and the like can be used. A variable resistance element takes any of two states of a low-resistance state and a high-resistance state. Here, the low-resistance state is defined as an on state. The high-resistance state is defined as an off state. Further, a state of a variable resistance element is correlated with program data. The low-resistance state is defined as a state of data 1. The high-resistance state is defined as a state of data 0. When a variable resistance element is in the on state, a signal that is given as a voltage level passes the variable resistance element. On the other hand, when a variable resistance element is in the off state, a signal is blocked off by the variable resistance element and does not pass through it.

FIG. 3 indicates an example of a structure of the switch block 2 of FIG. 1, and includes wirings H11, H12, H13, H04, V2, V3 and V4, and variable resistance elements R21, R22, R23, R24, R31, R32, R33, R34, R41, R42, R43 and R44. Here, the wiring H04 is a spare wiring, and the variable resistance elements R24, R34 and R44 are spare variable resistance elements. A wiring extending in the row direction and a wiring extending in the column direction can be set to the connecting state by changing the variable resistance element of the crossing position into the on state, and it can be set to the non-connecting state by changing it to the off state.

FIG. 4 indicates an example of a structure of the shifter block 6 of FIG. 1, and includes wirings H01, H02, H03, H04, H11, H12 and H13, and variable resistance elements R01, R02, R03, R01S, R02S and R03S. Here, the wiring H04 is a spare wiring.

As shown in FIG. 4, the shifter block 6 includes resistance networks RN1, RN2 and RN3. The resistance network RN1 includes the wiring
H01, the wiring H11, the wiring H12, the variable resistance element R01 formed between the wiring H01 and the wiring H11, and the variable resistance element R01S formed between the wiring H01 and the wiring H12. The resistance network RN2 includes the wiring H02, the wiring H12, the wiring H13, the variable resistance element R02 formed between the wiring H02 and the wiring H12, and the variable resistance element R02S formed between the wiring H02 and the wiring H13. The resistance network RN3 includes the wiring H03, the wiring H13, the wiring H04, the variable resistance element R03 formed between the wiring H03 and the wiring H13, and the variable resistance element R03S formed between the wiring H03 and the wiring H04.

Next, operations of a programmable logic integrated circuit of this exemplary embodiment will be described. The programmable logic integrated circuit in the first exemplary embodiment has two modes, and, in each of the modes, there are two situations of a situation that a defective element exists and a situation that a defective element does not exist, resulting in possibility of existence of total of four situations. The first mode is a mode to use a spare circuit for only relief of a defective element. The second mode is a mode to use a spare circuit not only for relief of a defective element, but also for increasing the flexibility of a circuit.

Figure 5:
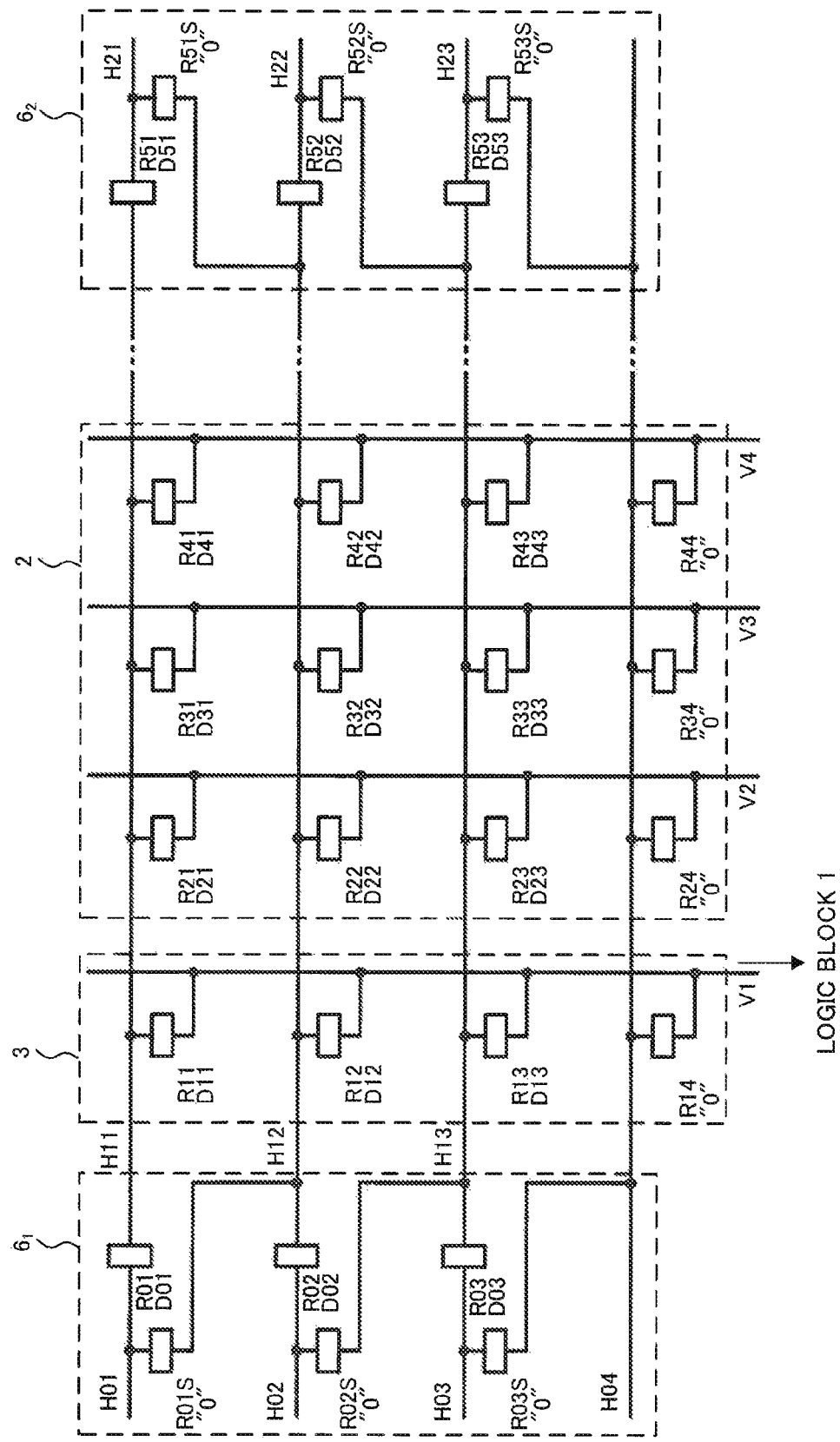
FIG. 5 is a circuit diagram showing relation between setting data and a variable resistance element in a situation that there is no defective element in a first mode of a programmable logic integrated circuit according to the first exemplary embodiment of the present invention.

FIG. 5 is a circuit diagram showing relation between setting data and a variable resistance element in a situation without any defective element in the first mode in the first exemplary embodiment of the present invention. FIG. 5 is part of the programmable logic integrated circuit shown in FIG. 1, and indicates the connection block 3, the switch block 2 and two shifter blocks on wiring extending in the row direction. The two shifter blocks are a first shifter block $6_1$ and a second shifter block $6_2$.

In the first mode, setting data is outputted as a result of logic synthesis and layout/wiring. Setting data Dxy corresponding to variable resistance element Rxy is shown in FIG. 5. Here, x is an integer of 0 to 5, and y is an integer of 1 to 3. In the first mode, the variable resistance elements R01S, R02S and R03S of the first shifter block are programmed into a state corresponding to data 0, that is, the off state. Also, variable resistance element R51S, R52S and R53S of the second shifter block are programmed into a state corresponded to data 0, that is, the off state. Furthermore, the variable resistance elements R14, R24, R34 and R44 on the spare wiring H04 are programmed into a state corresponding to data 0, that is, the off state. By setting the variable resistance elements as described above, a desired logic can be realized without using a spare circuit.

Figure 6:
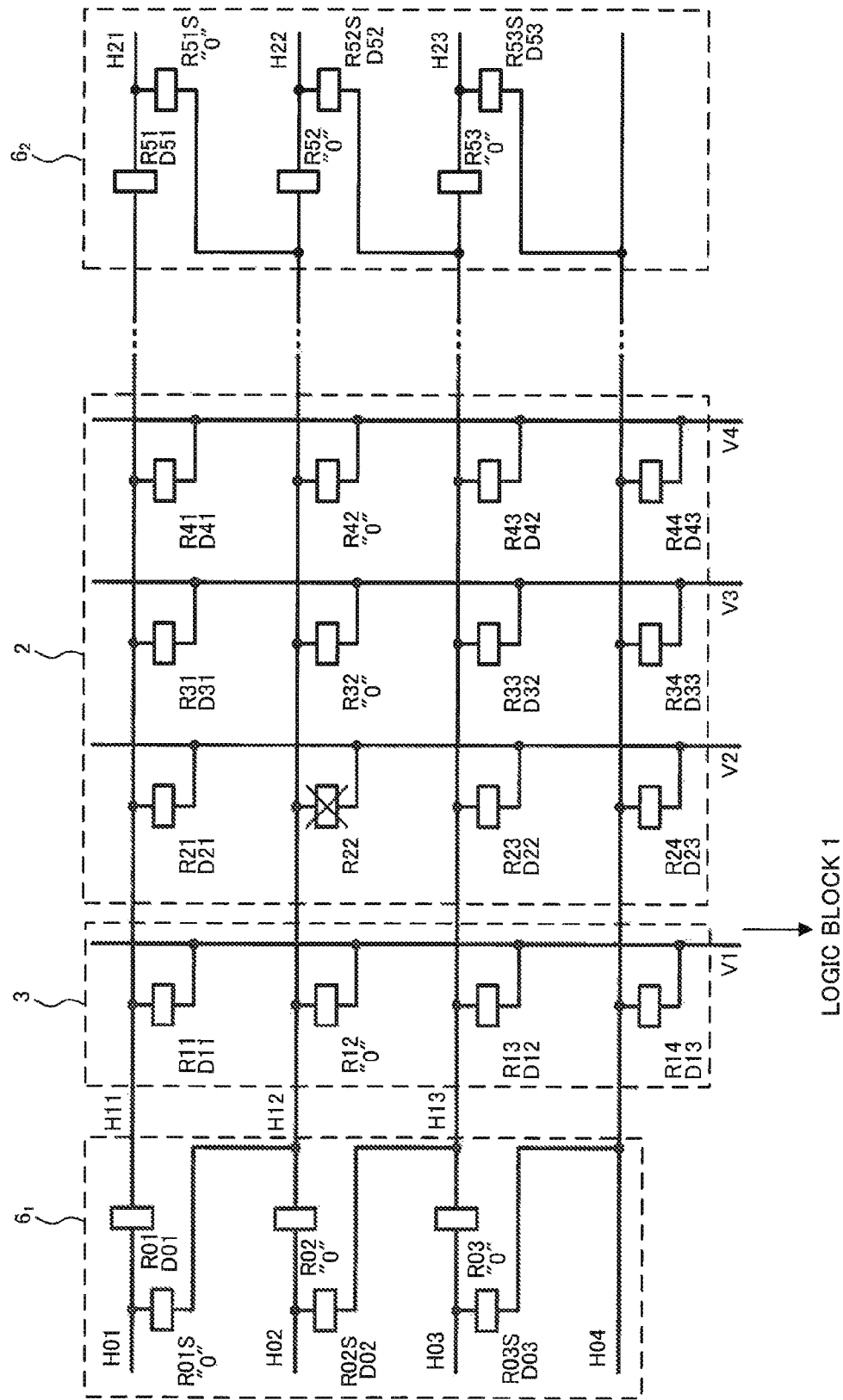
FIG. 6 is a circuit diagram showing relation between setting data and a variable resistance element in a situation that there is a defective element in the first mode of a programmable logic integrated circuit according to the first exemplary embodiment of the present invention.

FIG. 6 is a circuit diagram showing relation between setting data and a variable resistance element of a situation that a defective element exists in the first mode in the first exemplary embodiment of the present invention. FIG. 6 is part of the programmable logic integrated circuit shown in FIG. 1, and indicates the connection block 3, the switch block 2 and two shifter blocks on wiring extending in the row direction. The two shifter blocks are the first shifter block $6_1$ and the second shifter block $6_2$. A case in which, as a result of performing logic synthesis and layout/wiring so that the same logic as that of FIG. 5 may be realized, the same setting data as that of FIG. 5 is outputted will be described.

A case where the variable resistance element R22 on the wiring H12 of the second row from the top of FIG. 5 is defective will be described as an example. The variable resistance element R01 of the first resistance network of the first shifter block $6_1$ is programmed into a state corresponding to the data of D01, and the variable resistance element R01S of the first resistance network is programmed into a state corresponding to data "0", that is, the off state.

Further, the variable resistance element R02 of the second resistance network of the first shifter block $6_1$ is programmed into a state corresponding to data "0", that is, the off state, and the variable resistance element R02S of the second resistance network is programmed into a state corresponding to data D02.

Yet further, the variable resistance element R03 of the third resistance network of the first shifter block $6_1$ is programmed into a state corresponding to data "0", that is, the off state, and the variable resistance element R03S of the third resistance network is programmed into a state corresponding to data D03.

Further, a variable resistance element R51 of the first resistance network of the second shifter block $6_2$ is programmed into a state corresponding to the data of D51, and the variable resistance element R 51S of the first resistance network is programmed into a state corresponding to data "0", that is, the off state.

A variable resistance element R52 of the second resistance network of the second shifter block $6_2$ is programmed into a state corresponding to data "0", that is, the off state, and the variable resistance element R52S of the second resistance network is programmed into a state corresponding to data D52.

A variable resistance element R53 of the third resistance network of the second shifter block $6_2$ is programmed into a state corresponding to data "0", that is the off state, and the variable resistance element R03S of the third resistance network is programmed into a state corresponding to data D53.

Further, variable resistance elements Rx1 (R11, R21, R31 and R41) connected to the wiring H11 are programmed into a state corresponding to data Dx1 (D11, D21, D31 and D4). Variable resistance elements Rx2 (R12, R22, R32 and R42) connected to the wiring H12 are programmed into a state corresponding to data "0", that is, the off state. Variable resistance elements Rx3 (R13, R23, R33 and R43) connected to the wiring H13 are programmed into a state corresponding to data Dx2 (D12, D22, D32 and D42). Variable resistance elements Rx4 (R14, R24, R34 and R44) connected to the wiring H04 are programmed into a state corresponding to data Dx3 (D13, D23, D33 and D43). Here, x is an integer of 1 to 4.

When the variable resistance element R22 on the wiring H12 in the second row from the top in FIG. 5 is defective, the wiring H12 to which the defective element is connected is cut off by the above-mentioned program. Furthermore, by the above-mentioned program, the setting data of the variable resistance elements Rx2 connected to the wiring H12, the variable resistance elements Rx3 connected to the wiring H13 and the variable resistance elements Rx4 connected to the wiring H04 are shifted. Thus, it is possible to avoid the defective element and realize a desired logic by cutting off a wiring to which the defective element is connected, and by shifting setting data.

Figure 7:
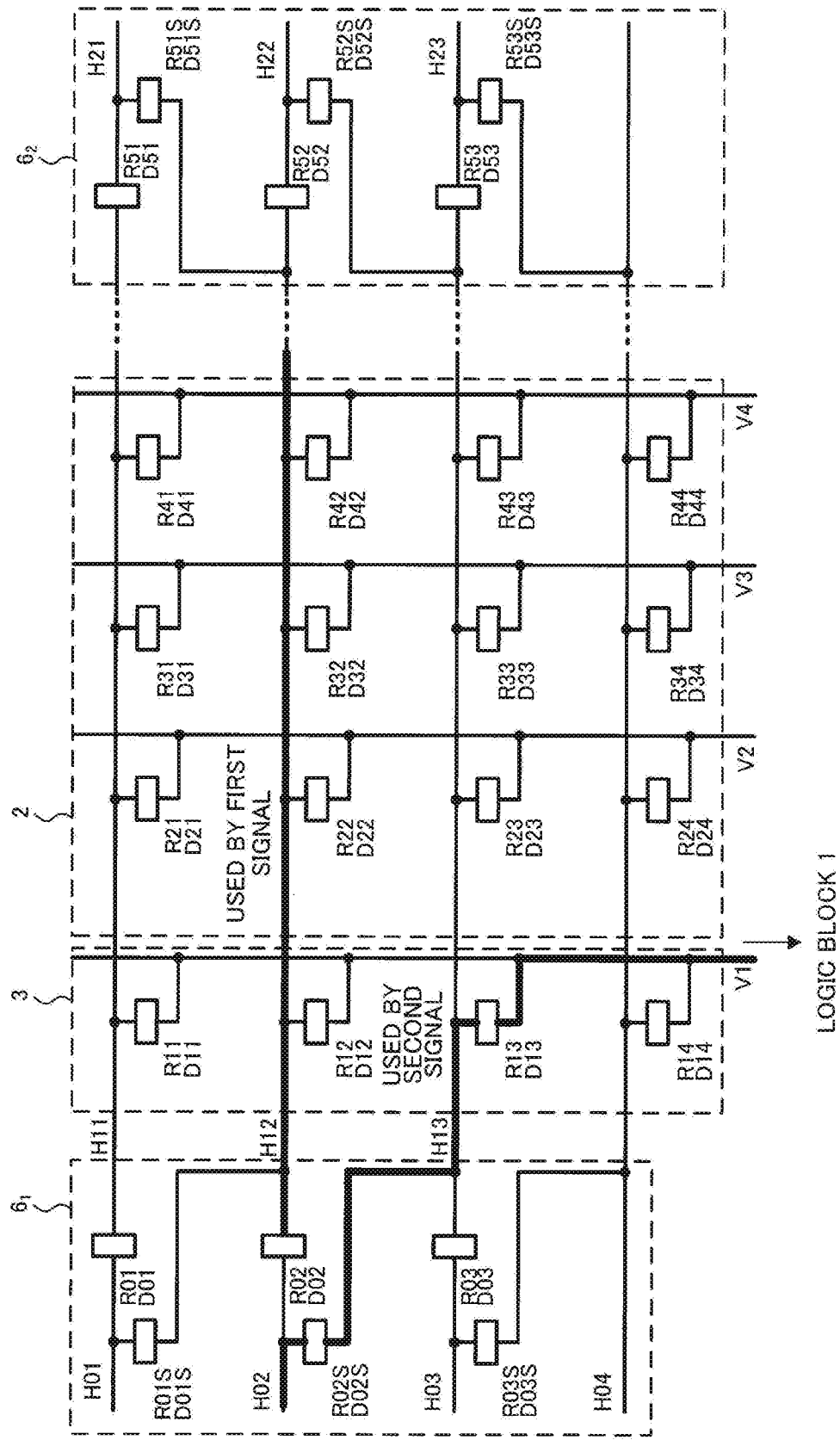
FIG. 7 is a circuit diagram showing relation between setting data and a variable resistance element in a second mode of a programmable logic integrated circuit according to the first exemplary embodiment of the present invention.

FIG. 7 is a circuit diagram showing relation between setting data and a variable resistance element in the second mode in the first exemplary embodiment of the present invention. FIG. 7 is part of the programmable logic integrated circuit shown in FIG. 2, and indicates the connection block 3, the switch block 2 and two shifter blocks on wiring extending in the row direction. The two shifter blocks are the first shifter block $6_1$ and the second shifter block $6_2$. The second mode is a mode in which, when there is no defective element, layout and routing is performed in consideration of shifter blocks, a spare wiring and a spare variable resistance element to realized more various logics. Meanwhile, when there is a defective element, layout and routing is performed so that the defective element may be avoided based on address information on the defective element. In FIG. 7, setting data Dxy corresponding to variable resistance elements Rxy is indicated. Here, x is an integer of 0 to 5, and y of 1 to 4. In FIG. 7, setting data D0yS corresponding to variable resistance elements R0yS of the first shifter block $6_1$ are indicated. Also in FIG. 7, setting data D5yS corresponding to variable resistance elements R5yS of the second shifter block $6_2$ are indicated.

As an example in which the flexibility of a circuit is improved, an example that uses a shifter block to avoid competition in wiring resources will be described. For example, it is supposed that the wiring H12 has been reserved at a given step in layout and routing in order to transmit a first signal. At that time, in a case when a second signal is desired to be transmitted to the wiring V1 via the variable resistance elements R02 and R12 from the wiring H02, for example, competition of the wiring resource of the wiring H12 arises. In the second mode in which a shifter block can be used, competition of a wiring resource can be dissolved because the second signal can be made to be transmitted to the wiring V1 via the variable resistance element R02S and R13 from the wiring H02. By using a spare circuit as above, competition of wiring resources can be reduced to realize more various kinds of circuits.

Meanwhile, a setting pin may be provided in the programmable logic integrated circuit in order to select the first mode and the second mode. Otherwise, a setting register may be provided in the programmable logic integrated circuit.

Meanwhile, although shifter blocks are arranged in both ends of wiring extending in the row direction in the programmable logic integrated circuit in the first exemplary embodiment, it may be arranged to a wiring periodically, not both ends of the wiring. In addition, a shifter block may also be arranged on a wiring extending in the column direction.

Figure 8:
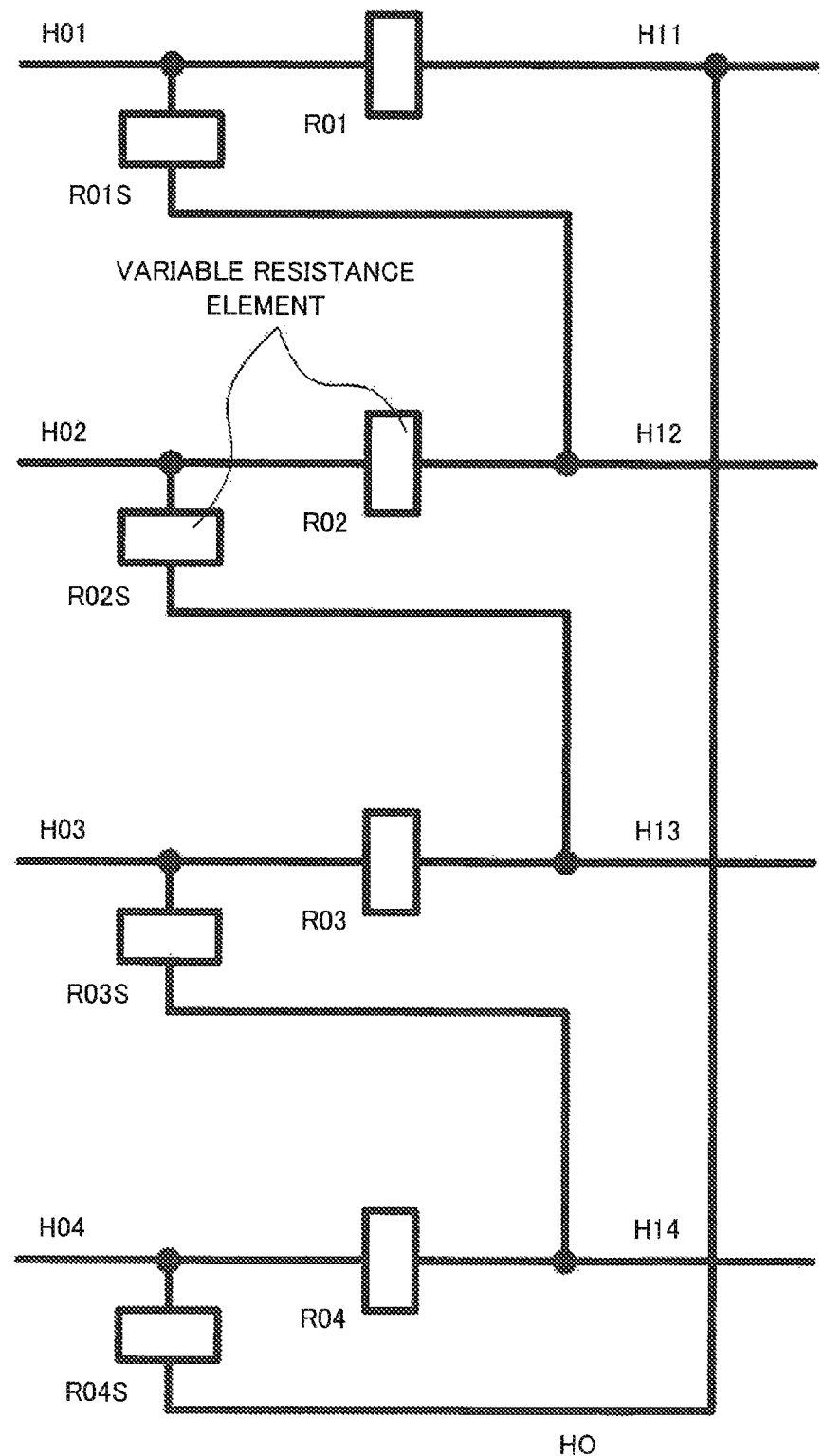
FIG. 8 is a circuit diagram showing the other example of a shifter block of a programmable logic integrated circuit according to the first exemplary embodiment of the present invention.

Meanwhile, a cyclic shifter circuit shown in FIG. 8 may be used instead of the shifter block 6 of FIG. 4. Compared with the shifter block 6 of FIG. 4, the cyclic shifter circuit shown in FIG. 8 is different in a point that a variable resistance element R04, a variable resistance element R04S and a wiring H0 for circulation are added. According to the shifter circuit shown in FIG. 8, a signal can be made to be transmitted to the wiring H11 from the wiring H04 via the variable resistance element R04S and the wiring H0 for circulation.

As described above, according to this exemplary embodiment, it is possible to avoid a defective element using the shifter block 6 ($6_1$, and $6_2$) and a spare circuit to realize a desired logic circuit. In addition, in the first mode, quality of a programmable logic integrated circuit can be maintained constant. In the second mode, although quality of a programmable logic integrated circuit varies, more various kinds of circuits can be realized.

[Second Exemplary Embodiment]

Figure 9:
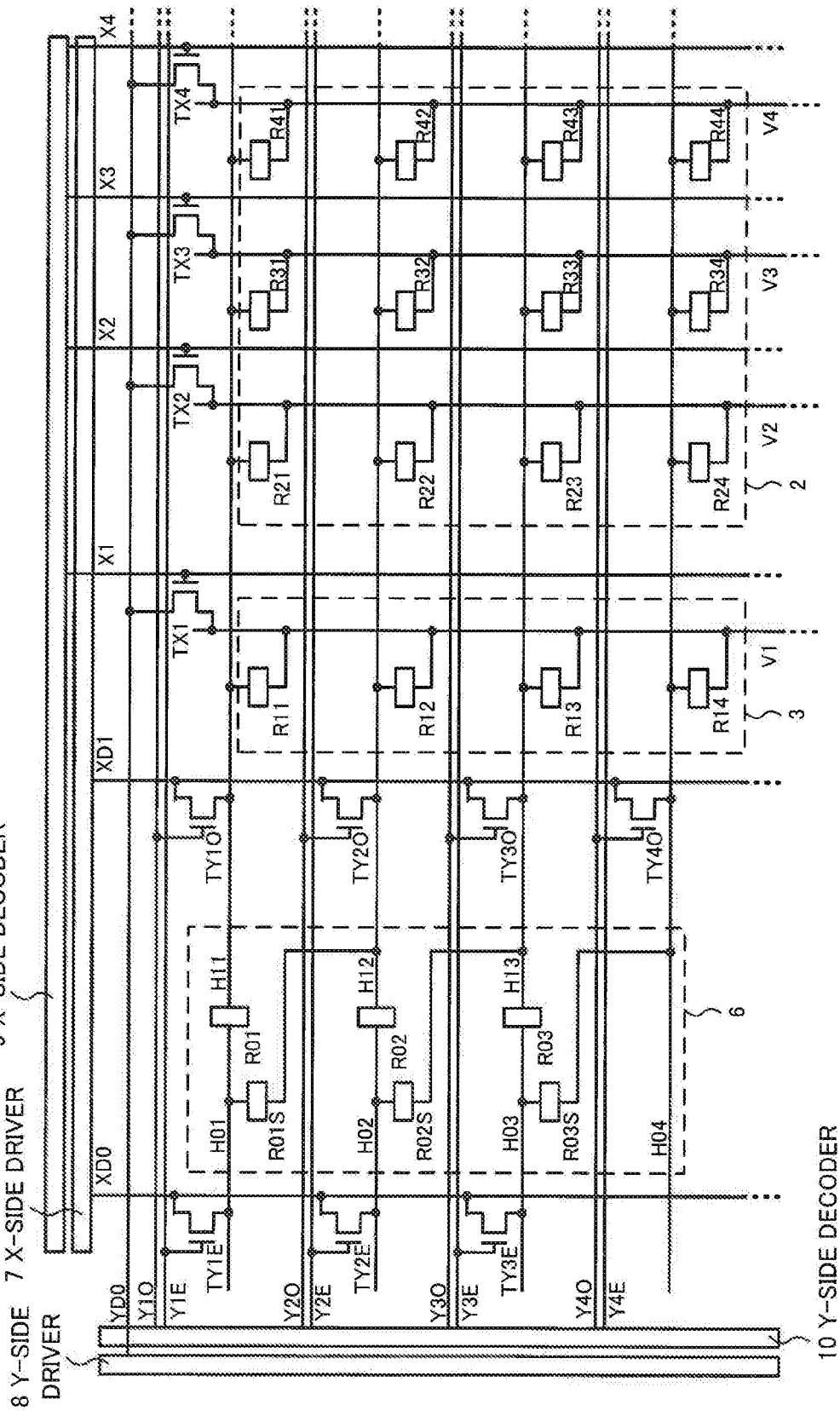
FIG. 9 is a block diagram showing a structure of a programmable logic integrated circuit according to a second exemplary embodiment of the present invention.

Next, a programmable logic integrated circuit according to the second exemplary embodiment of the present invention will be described. FIG. 9 is a block diagram showing part of a structure of a programmable logic integrated circuit according to the second exemplary embodiment of the present invention.

A programmable logic integrated circuit according to this exemplary embodiment includes the switch block 2, the connection block 3 and the shifter block 6, as is the case with a programmable logic integrated circuit according to the first exemplary embodiment. FIG. 9 is part of the programmable logic integrated circuit shown in FIG. 1, and indicates the connection block 3, the switch block 2 and the shifter block 6 on wiring extending in the row direction. As shown in FIG. 9, the programmable logic integrated circuit according to this exemplary embodiment further includes an X-side decoder 9, an X-side driver 7, a Y-side decoder 10 and a Y-side driver 8. The X-side decoder 9 extends in the row direction, and drives X selection lines X1, X2, X3 and X4 extending in the column direction. The X-side driver 7 extends in the row direction, and drives X driver lines XD0 and XD1 extending in the column direction. The Y-side decoder 10 extends in the column direction, and drives Y selection lines Y1O, Y1E, Y2O, Y2E, Y3O, Y3E, Y4O and Y4E extending in the row direction. The Y-side driver 8 extends in the column direction, and drives Y driver line YD0 extending in the row direction.

As shown in FIG. 9, the programmable logic integrated circuit according to this exemplary embodiment further includes a transistor TYyE. Taking y as an integer of 1 to 3, in the transistor TYyE, a source is connected to a wiring H0y, a drain is connected to X driver line XD0, and a gate is connected to Y selection line YyE.

As shown in FIG. 9, the programmable logic integrated circuit according to this exemplary embodiment further includes transistors TYyO. Taking y as an integer of 1 to 3, in the transistor TYyO, a source of that is connected to a wiring H1y, a drain of that is connected to X driver line XD1, and a gate of that is connected to Y selection line YyO. In FIG. 9, there is shown a case where y is 4, that is, a transistor TY4O is connected to the wiring H04 at its source, connected to the X driver line XD1 at its drain, and connected to the Y selection line Y4O at its gate.

Access to a variable resistance element in the shifter block 6 is realized by switching Y selection lines YyE and YyO by transistors (TYyE, and TYyO) located in the left and the right portions outside the shifter block 6.

As shown in FIG. 9, the programmable logic integrated circuit according to this exemplary embodiment further includes transistors TXx. Taking x as an integer of 1 to 4, the transistor TXx is connected to the wiring Vx at its source, connected to the Y driver line YD0 at its drain, and connected to the X selection line Xx at its gate. Access to a variable resistance element in the connection block 3 and the switch block 2 is realized using the transistors TYyO and TXx.

Regarding reading of a variable resistance element, a state of the variable resistance element can be distinguished by applying a read voltage Vr to both ends of the variable resistance element and sensing electric current which flows through the variable resistance element. Regarding programming of data 0 to a variable resistance element, the element can be made to be the off state by applying a programming voltage −Vp between its both ends. Regarding programming of data 1 to a variable resistance element, it can be made to be the on state by applying a programming voltage +Vp between its both ends.

A stand-by state will be described. In the stand-by state, all X selection lines and Y selection lines are driven to a Low level. All X-side driver 7 and Y-side driver 8 are driven to a Low level.

The read operation of a variable resistance element in the shifter block 6 will be described. Description will be made taking reading from the variable resistance element R02 as an example. When the read operation starts following the stand-by state, Y selection lines Y2E and Y2O are driven to a High level, and the X driver lines XD0 and XD1 are driven in a way that one of them is driven to a Low level and the other to a voltage Vr. The transistors TY2E and TY2O come to be in the on state. The other X driver lines and Y driver lines are set to a floating state. Data can be distinguished by sensing a read current Ir which flows through the variable resistance element R02.

Program operations of a variable resistance element in the shifter block 6 will be described. Writing from variable resistance element R02 will be described as an example. When a writing operation starts following the stand-by state, all X selection lines and Y selection lines are driven to a High level. All X drivers and Y drivers are driven to Vp/2 level. Next, Y selection lines Y2E and Y2O are driven to a High level, and Y selection lines and X selection lines besides those are driven to a Low level. One of the X driver lines XD0 and XD1 is set to a Low level and the other is driven to the voltage Vp, according to write data. Transistors TY2E and TY2O come to be in the on state. The other X driver lines and Y driver lines are set to a floating state. By the voltage applied to the variable resistance element R02, desired data can be programmed.

Read operations of a variable resistance element in the connection block 3 or the switch block 2 will be described. Description will be made taking reading from the variable resistance element R12 as an example. When a read operation starts following the stand-by state, the Y selection line Y2O is driven to a High level, the X selection line X1 is driven to a High level, and one of the X driver line XD1 and the Y driver line YD0 is driven to a Low level and the other is driven to the voltage Vr. Transistors TY2O and TX1 come to be in the on state. The other X driver lines and Y driver lines are set to a floating state. Data can be distinguished by sensing read current Ir that flows through the variable resistance element R12.

Programming operations of a variable resistance element in the connection block 3 or the switch block 2 will be described. Description will be made taking writing from variable resistance element R12 as an example. When a writing operation starts following the stand-by state, all X selection lines and Y selection lines are driven to a High level. All X drivers and Y drivers are driven to Vp/2 level. The Y selection line Y2O is driven to a High level, and the X selection line X1 is also driven to a High level, and the other Y selection lines and X selection lines are driven to a Low level. One of the X driver line XD1 and the Y driver line YD0 is set to a Low level and the other is driven to the voltage of Vp, according to write data. The transistors TY2O and TX1 come to be in the on state. The other X driver lines and Y driver lines are set to a floating state. By a voltage applied to the variable resistance element R12, desired data can be programmed.

Meanwhile, according to address information on a defective element, the X-side decoder 9, the X-side driver 7, the Y-side decoder 10 and the Y-side driver 8 may be configured so that data to be written in may be shifted as indicated in the first exemplary embodiment of the present invention.

As described above, because variable resistance elements of the shifter block 6, the connection block 3 and the switch block 2 can be programmed into a desired state according to this exemplary embodiment, it is possible to avoid a defective element to realize a desired logic circuit.

Although preferred exemplary embodiments of the present invention have been described above, the present invention is not limited to those. Various modifications are possible within the scope of the inventions indicated in the scope of claims, and it is obvious that those are also included within the scope of the present invention.

Part or whole of the above-mentioned embodiments can also be described as, but not limited to, the following supplementary notes.

(Supplementary note 1) A programmable logic integrated circuit comprising:
a plurality of logic blocks;
a switch block which switches connection between row wiring and column wiring by a non-volatile switching element for switching; and
a shifter block which connects input-output wiring to the switch block, wherein
the shifter block includes a redundant wiring, and is provided with a non-volatile switching element for shifting to control connection of each wiring included in the redundant wiring and the row wiring.

(Supplementary note 2) A programmable logic integrated circuit provided with a resistance network comprising: at least a first wiring; a second wiring; a third wiring; a first variable resistance element formed between the first wiring and the second wiring; and a second variable resistance element formed between the first wiring and the third wiring, wherein, in a first utilizing state of the resistance network, the first variable resistance element is programmed into a state corresponding to first data, and the second variable resistance element is programmed into an off state, and, in a second utilizing state of the resistance network, the first variable resistance element is programmed into the off state, and the second variable resistance element is programmed into a state corresponding to the first data.

(Supplementary note 3) The programmable logic integrated circuit according to supplementary note 2, further comprising: a third variable resistance element; and a fourth wiring for circulation to connect between wirings not being adjacent to each other among a plurality of wirings including the first wiring via the third variable resistance element.

(Supplementary note 4) The programmable logic integrated circuit according to supplementary note 2 or supplementary note 3, comprising a shifter block including N pieces of the resistance network arranged adjacent to each other, given that N being an integer, wherein, given that i is an integer of from 1 to N−1, a third wiring of i-th resistance network and a second wiring of (i+1)-th resistance network are a common wiring, and wherein,
given that j is an integer of from 1 to N,
if i is smaller than j, i-th resistance network is in the first utilizing state, and a first variable resistance element of the i-th resistance network is programmed into a state corresponding to first data, and a second variable resistance element of the i-th resistance network is programmed in an off state, and if i is equal to or larger than j i-th resistance network is in the second utilizing state, and i-th first variable resistance element is programmed into the off state, and i-th second variable resistance element is programmed into a state corresponding to i-th data.

(Supplementary note 5) The programmable logic integrated circuit according to supplementary note 4, further comprising:

a plurality of tracks;

a switch block to specify a connection relationship between the plurality of tracks;

a logic block to perform a logical operation; and a connection block to specify a connection relationship between the plurality of tracks and the logic block, wherein a first wiring, a second wiring and a third wiring of the shifter block are connected to the tracks, and wherein, when, in i-th track connected to a second wiring of i-th resistance network of the shifter block, i is smaller than j, a variable resistance element set of the connection block or the switch block connected to i-th track is programmed into a state corresponding to i-th data set.

(Supplementary note 6) The programmable logic integrated circuit according to supplementary note 4, further comprising:

a plurality of tracks;

a switch block to specify a connection relationship between the plurality of tracks;

a logic block to perform a logical operation; and a connection block to specify a connection relationship between the plurality of tracks and the logic block, wherein a first wiring, a second wiring and a third wiring of the shifter block are connected to the tracks, and wherein, when, in i-th track connected to a second wiring of i-th resistance network of the shifter block, i is equal to j, a variable resistance element set of the connection block or the switch block connected to i-th track is programmed into an off state.

(Supplementary note 7) The programmable logic integrated circuit according to supplementary note 4, further comprising:

a plurality of tracks;

a switch block to specify a connection relationship between the plurality of tracks;

a logic block to perform a logical operation; and a connection block to specify a connection relationship between the plurality of tracks and the logic block, wherein a first wiring, a second wiring and a third wiring of the shifter block are connected to the tracks, and wherein, when, in i-th track connected to a second wiring of i-th resistance network of the shifter block, i is larger than j, a variable resistance element set of the connection block or the switch block connected to (i+1)-th track is programmed into a state corresponding to i-th data set.

(Supplementary note 8) The programmable logic integrated circuit according to any one of supplementary notes 2 to 7, comprising:

a first transistor on a first wiring of the resistance network;

a second transistor on a second wiring of the resistance network; and a third transistor on a third wiring of the resistance network, wherein the first transistor and the second transistor are set to an on state and the third transistor is set to an off state to rewrite data of the first variable resistance element, and wherein the first transistor and the third transistor are set to the on state and the second transistor is set to the off state to rewrite data of the second variable resistance element.

(Supplementary note 9) The programmable logic integrated circuit according to any one of supplementary notes 2 to 8, comprising a first mode and a second mode, wherein the first mode includes performing logic synthesis and layout and routing for realizing a desired circuit in a manner taking an available number of wirings connected to the shifter block as N, and, further, determining a numerical value of j according to address information on a defective element, and wherein the second mode includes performing logic synthesis and layout and routing for realizing a desired circuit in a manner taking an available number of wirings connected to the shifter block as N+1.

(Supplementary note 10) The programmable logic integrated circuit according to supplementary note 9, wherein the logic synthesis and the layout and routing is performed in consideration of address information on a defective element.

(Supplementary note 11) The programmable logic integrated circuit according to supplementary note 9 or supplementary note 10, wherein the first mode and the second mode are determined by a numerical value of a setting value of an external pin for mode setting or by a numerical value of a register for mode setting.

This application is based upon and claims the benefit of priority from Japanese patent application No. 2014-53302, filed on Mar. 17, 2014, the disclosure of which is incorporated herein in its entirety by reference.

REFERENCE SIGNS LIST

1 Logic block
2 Switch block
3 Connection block
4 Wiring
5 I/O block
6, $6_1$ and $6_2$ Shifter block
7 X-side driver
8 Y-side driver
9 X-side decoder
10 Y-side decoder

The invention claimed is:

1. A programmable logic integrated circuit comprising:
a plurality of logic blocks;
a switch block which switches connection between row wiring and column wiring by a non-volatile switching element for switching; and
a shifter block which connects input-output wiring to the switch block, wherein
the shifter block includes a redundant wiring, and a non-volatile switching element for shifting to control connection of each wiring included in the redundant wiring and the row wiring.

2. A programmable logic integrated circuit provided with a resistance network comprising: at least a first wiring; a second wiring; a third wiring; a first variable resistance element formed between the first wiring and the second wiring; and a second variable resistance element formed between the first wiring and the third wiring, wherein, in a first utilizing state of the resistance network, the first variable resistance element is programed into a state corresponding to first data, and the second variable resistance element is programed into an off state, and wherein, and in a second utilizing state of the resistance network, the first variable resistance element is programed into the off state, and the second variable resistance element is programed into a state corresponding to the first data.

3. The programmable logic integrated circuit according to claim 2, further comprising a shifter block including N pieces of the resistance network arranged adjacent to each other, given that N being an integer, wherein, given that i is an integer of from 1 to N−1, a third wiring of i-th resistance network and a second wiring of (i+1)-th resistance network are a common wiring, and wherein, given that j is an integer of from 1 to N, if i is smaller than j, i-th resistance network is in the first utilizing state, and a first variable resistance element of the i-th resistance network is programed into a state corresponding to first data, and a second variable resistance element of the i-th resistance network is programed in an off state, and if i is equal to or larger than j i-th resistance network is in the second utilizing state, and i-th first variable resistance element is programed into the off state, and i-th second variable resistance element is programed into a state corresponding to i-th data.

4. The programmable logic integrated circuit according to claim 3, further comprising: a plurality of tracks; a switch block to specify a connection relationship between the plurality of tracks; a logic block to perform a logical operation; and a connection block to specify a connection relationship between the plurality of tracks and the logic block, wherein a first wiring, a second wiring and a third wiring of the shifter block are connected to the tracks, and wherein, when, in i-th track connected to a second wiring of i-th resistance network of the shifter block, i is smaller than j, a variable resistance element set of the connection block or the switch block connected to i-th track is programed into a state corresponding to i-th data set.

5. The programmable logic integrated circuit according to claim 3, further comprising: a plurality of tracks; a switch block to specify a connection relationship between the plurality of tracks; a logic block to perform a logical operation; and a connection block to specify a connection relationship between the plurality of tracks and the logic block, wherein a first wiring, a second wiring and a third wiring of the shifter block are connected to the tracks, and wherein, when, in i-th track connected to a second wiring of i-th resistance network of the shifter block, i is equal to j, a variable resistance element set of the connection block or the switch block connected to i-th track is programed into an off state.

6. The programmable logic integrated circuit according to claim 3, further comprising: a plurality of tracks; a switch block to specify a connection relationship between the plurality of tracks; a logic block to perform a logical operation; and a connection block to specify a connection relationship between the plurality of tracks and the logic block, wherein a first wiring, a second wiring and a third wiring of the shifter block are connected to the tracks, and wherein, when, in i-th track connected to a second wiring of i-th resistance network of the shifter block, i is larger than j, a variable resistance element set of the connection block or the switch block connected to (i+1)-th track is programed into a state corresponding to i-th data set.

7. The programmable logic integrated circuit according to claim 2, further comprising:

a first transistor on a first wiring of the resistance network; a second transistor on a second wiring of the resistance network; and a third transistor on a third wiring of the resistance network, wherein the first transistor and the second transistor are set to an on state and the third transistor is set to an off state to rewrite data of the first variable resistance element, and wherein the first transistor and the third transistor are set to the on state and the second transistor is set to the off state to rewrite data of the second variable resistance element.

8. The programmable logic integrated circuit according to claim 2, further comprising a first mode and a second mode, wherein the first mode includes performing logic synthesis and layout and routing for realizing a desired circuit in a manner taking an available number of wirings connected to the shifter block as N, and, further, determining a numerical value of j according to address information on a defective element, and wherein the second mode includes performing logic synthesis and layout and routing for realizing a desired circuit in a manner taking an available number of wirings connected to the shifter block as N+1.

9. The programmable logic integrated circuit according to claim 8, wherein the logic synthesis and the layout and routing is performed in consideration of address information on a defective element.

10. The programmable logic integrated circuit according to claim 8, wherein the first mode and the second mode are determined by a numerical value of a setting value of an external pin for mode setting or by a numerical value of a register for mode setting.

* * * * *